United States Patent [19]

Smith et al.

[11] 4,092,692
[45] May 30, 1978

[54] OVERLOAD PROTECTION CIRCUIT

[75] Inventors: Gerald D. Smith; Frank R. Owens, both of Indianapolis, Ind.

[73] Assignee: Carson Manufacturing Company, Indianapolis, Ind.

[21] Appl. No.: 669,994

[22] Filed: Mar. 24, 1976

Related U.S. Application Data

[63] Continuation-in-part of Ser. No. 580,955, May 27, 1975, abandoned.

[51] Int. Cl.² .............................................. H02H 7/20
[52] U.S. Cl. ................................. 361/94; 330/207 P; 361/98; 361/110
[58] Field of Search ................... 361/93, 98, 100, 101, 361/110, 91, 94; 330/207 P; 331/62; 321/11, 14

[56] References Cited

U.S. PATENT DOCUMENTS

| | | | |
|---|---|---|---|
| 3,177,402 | 4/1965 | Muchnick et al. | 361/18 |
| 3,206,695 | 9/1965 | Bennett, Jr. | 331/62 |
| 3,230,440 | 1/1966 | Kleiner | 321/11 |
| 3,308,391 | 3/1967 | McNamee | 330/207 P X |
| 3,345,570 | 10/1967 | Matyckas | 330/207 P X |
| 3,512,097 | 5/1970 | Tyler | 330/207 P |
| 3,648,111 | 3/1972 | Howe | 361/50 |

*Primary Examiner*—Patrick R. Salce
*Attorney, Agent, or Firm*—Gust, Irish, Jeffers & Rickert

[57] ABSTRACT

This invention provides overload protection to power components such as power transistors. A pair of driver transistors is connected in push-pull configuration and is coupled through an auto transformer to a pair of power transistors also connected in push-pull configuration. An impedance-matching transformer couples the pair of power transistors to a load circuit, such as a speaker. A low turn winding is connected in series with the secondary winding of the impedance-matching transformer, and drives a high turn winding in a silicon controlled rectifier trigger circuit which is triggered "on" when an overload condition exists in the low turn winding. Upon conduction of the silicon controlled rectifier, a switching transistor is switched "on" and this, in turn, switches "off" a power disabling transistor which is connected directly to, and in power disabling relation to, the pair of driver transistors.

7 Claims, 3 Drawing Figures

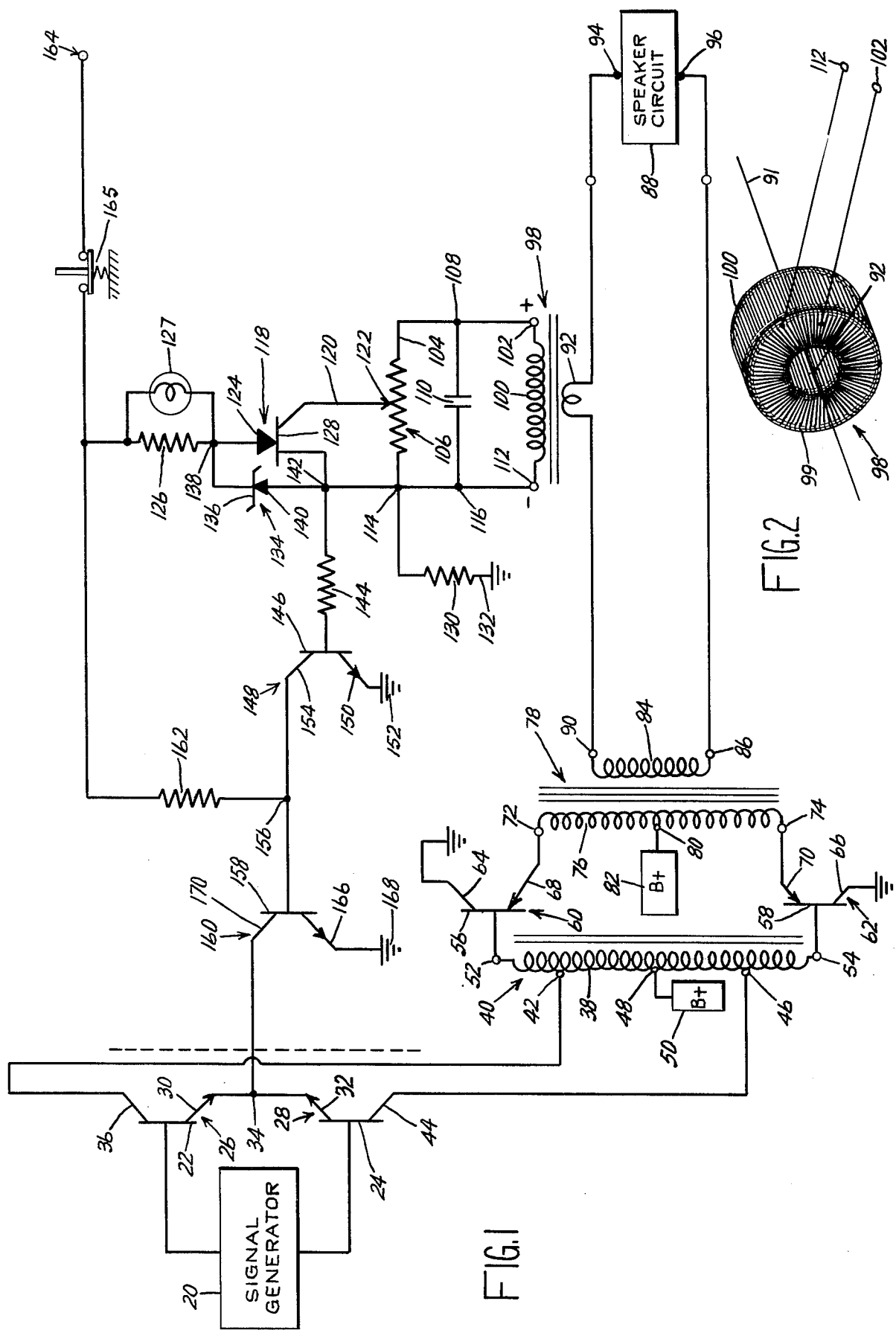

OVERLOAD PROTECTION CIRCUIT

CROSS-REFERENCE TO RELATED APPLICATION

This is a continuation-in-part of our copending application filed May 27, 1975, Ser. No. 580,955; and now abandoned, entitled OVERLOAD PROTECTION CIRCUIT.

BACKGROUND OF THE INVENTION

1. Field of the Invention

This invention relates to overload protection circuitry and more particularly to circuitry for protecting the output stages of an audio amplifier against damage by reason of a sudden speakercircuit overload.

2. Description of the Prior Art

Numerous overload circuits in the prior art have been designed to correct for overload conditions. These overload circuits have taken many forms from a simple fuse to complex circuitry.

SUMMARY OF THE INVENTION

In a circuit, such as a speaker drive circuit, it is desirable to have an overload circuit that is immediately responsive to an overload condition due to speaker short circuits, incorrect speaker connections or an excessive speaker load. However, the overload circuit should not be responsive to transient power surges. The circuit should isolate the speaker from d.c. currents and should present negligible losses in the speaker circuit. Further, the circuit should act positively to interrupt and disable directly the signal source in order to protect the power components most subject to damage for both overload conditions and for overvoltage in the power supply. All of the above should be adaptable to speaker circuits which typically embody transformer circuitry.

The overload protective circuit of this invention is particularly adapted to a speaker circuit wherein push-pull connected power transistors, transformer coupled to the output circuit, are utilized. The overload circuitry is immediately responsive to a damaging overload condition but will not be actuated by transient power surges. The circuitry is designed to protect against overvoltage in the power supply circuit.

A pair of driver transistors in push-pull relation is connected to a signal generator. The pair of driver transistors is transformer coupled to a pair of power transistors which are in push-pull relation. The pair of power transistors is connected through an impedance-matching transformer to a speaker circuit. A conductor is in the secondary circuit of the impedance-matching transformer and carries an overload current due to speaker short circuits, incorrect speaker connections or an overload number of speakers in the circuit. A high turn winding on an annulus of magnetic material is magnetically coupled to the conductor and upon overload, develops a trigger threshold voltage to the gate of a silicon controlled rectifier. The silicon controlled rectifier reacts substantially immediately to the trigger voltage within a portion of a cycle, turning "on" a switching transistor which, in turn, turns a disabling transistor "off". The disabling transistor is in the emitter circuit of each of the driver transistors which disables the apir of driver transistors to provide overload protection to the power transistors. The overload circuit is connected between the load and the driver transistors in a path parallel to the power transistor. A zener diode is connected in parallel to the current conducting electrodes of the silicon controlled rectifier to act as a power supply overvoltage controller to protect the components of the output stage. In another preferred embodiment, similar in componentry and operation to the first embodiment, a resistor is placed in shunt across the high turn winding to provide a waveform of desired triggering characteristics. A diode is placed between one terminal of the resistor and an integrating capacitor connected in shunt to the high turn winding and the diode. Thus, a noise immune d.c. trigger signal is provided to the silicon controlled rectifier. Such noise immunity is particularly desirable in low temperature ambient conditions.

It is therefore an object of this invention to provide an overload circuit for an amplifier which is responsive substantially immediately to an overload condition to protect the amplifier against damage.

Another object of this invention is to provide in the circuitry of the foregoing object a circuit which provides substantially loss-less, d.c. isolated coupling between the load circuit and the overload control circuitry.

A further object is to provide in the circuitry of the foregoing objects a noise immune, d.c. overload control signal.

The above-mentioned and other features and objects of this invention and the manner of attaining them will become more apparent and the invention itself will be best understood by reference to the following description of an embodiment of the invention taken in conjunction with the accompanying drawings.

BRIEF DESCRIPTION OF THE DRAWINGS

FIG. 1 is a schematic diagram, shown partially in block diagram, of a preferred embodiment of this invention;

FIG. 2 is a perspective view of a toroidal transformer used in the circuit; and

DESCRIPTION OF THE PREFERRED EMBODIMENTS

Figure 3:
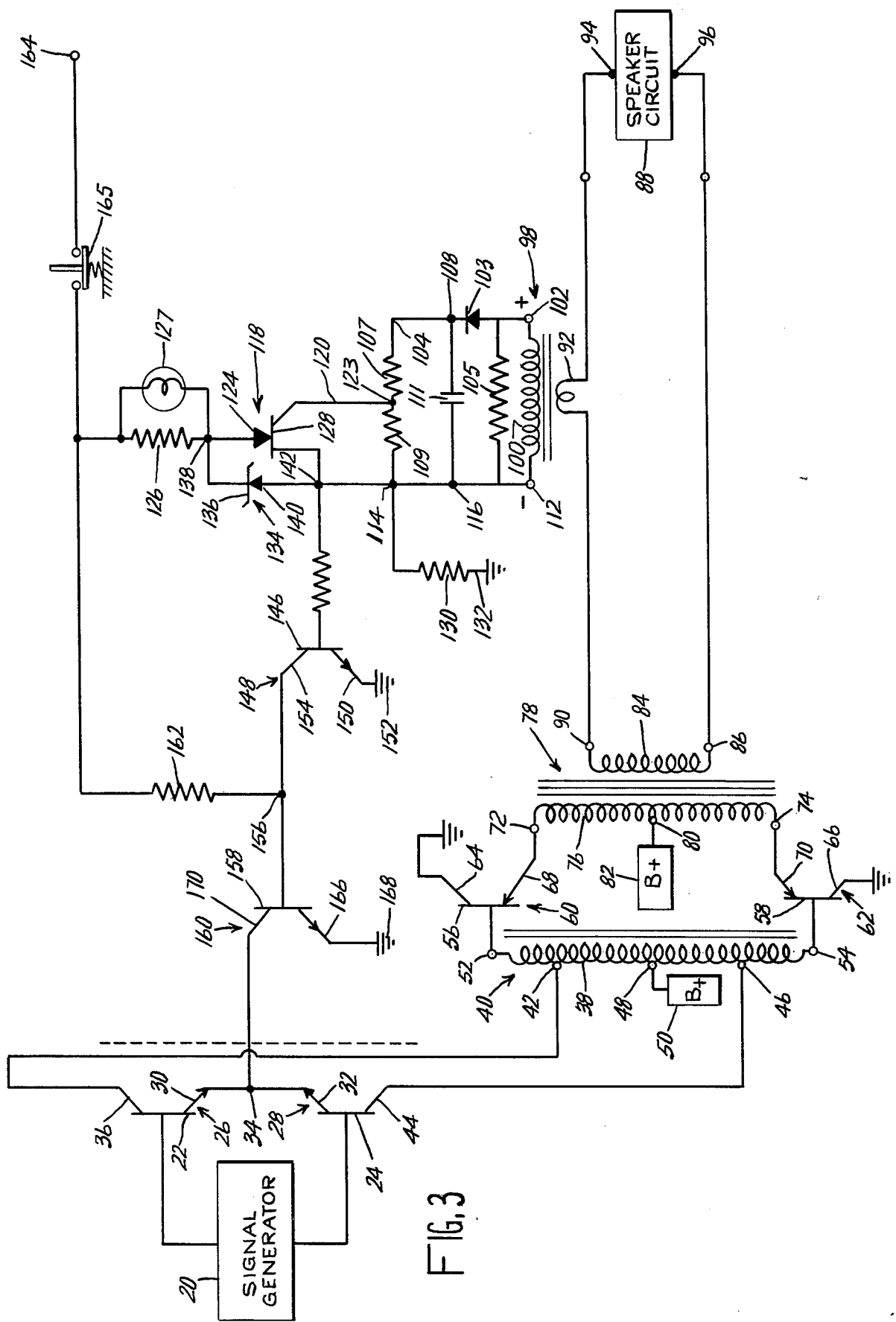
FIG. 3 is a schematic diagram shown partially in block diagram, of another preferred embodiment.

Referring to FIG. 1, a signal generator 20 may take the form of the signal generating circuitry shown in U.S. Pat. No. 3,747,092 issued July 17, 1973, to Gerald D. Smith and entitled "Electronic Siren Circuit." Generator 20 is connected to the bases 22 and 24 of driver transistors 26 and 28, respectively. Emitters 30 and 32 of transistors 26 and 28, respectively, are connected to common point 34. Collector 36 of transistor 26 is connected to winding 38 of auto transformer 40 at connection point 42 while collector 44 of transistor 28 is connected to winding 38 at point 46. Winding 38 is center tapped at point 48 to the B+ terminal of power supply 50. Transistors 26 and 28 are connected in push-pull, so that when one transistor is conducting the other is not.

The output connections 52 and 54 of winding 38 connect respectively to the bases 56 and 58 of a pair of diffused base power transistors 60 and 62, respectively. Transistors 60 and 62 have their collectors 64 and 66, respectively, connected to ground and their emitters 68 and 70 connected respectively to opposite ends 72 and 74 of primary winding 76 of impedance-matching transformer 78. Winding 76 is center tapped at point 80 which is connected to a source 82 of B+ potential. The circuitry thus far described may be the same as disclosed in U.S. Pat. No. 3,747,092.

Secondary winding 84 of impedance-matching transformer 78 has one end 86 connected to terminal 96 of a speaker or speaker circuit 88 and the other end 90 through a single turn winding 92 to the other terminal 94 of speaker or load circuit 88. Single turn winding 92 is the primary of transformer 98 which has a secondary winding 100 connected at end 102 to terminal 104 of potentiometer 106 and to terminal 108 of capacitor 110.

The transformer 98 is in toroidal form with the secondary winding 100 helically encircling an annular magnetic core 99 and the primary 92 being a straight wire 91 passing axially through the core which also conductively connects terminal 90 to terminal 94. Wire 91 has a negligible impedance loss and transformer 98 isolates speaker circuit 88 from any d.c. signals in winding 100. The other end 112 of secondary 100 is connected at point 114 to potentiometer 106 and at terminal 116 to capacitor 110. Silicon controlled rectifier 118 has its gate electrode 120 connected to slider 122 of potentiometer 106, its anode 124 connected at junction 138 to a resistor 126 and its cathode 128 connected through junctions 142 and 114 to resistor 130.

Silicon controlled rectifiers have the property that once gated "on," the rectifier remains "on" until the anode current is disrupted. Momentary opening of reset switch 165 turns rectifier 118 "off." Overload light indicator 127 is placed in parallel across resistor 126 and when illuminated indicates an overload condition. Resistor 130 is grounded at 132.

Zener diode 134 has its cathode 136 connected to juncture 138 and its anode 140 to juncture 142 which, in turn, is connected to the cathode 128 of silicon controlled rectifier 118. Current-limiting resistance 144 has one end connected to junction 142 and the other end connected to base 146 of overload switching transistor 148. Emitter 150 of NPN transistor 148 is connected to ground 152 and collector 154 to junction 156 and to base 158 of disabling NPN transistor 160. Biasing resistor 162 is also connected to junction 156. Resistors 126 and 162 are connected at their upper ends to B+ terminal 164 through a normally closed reset switch 165. Emitter 166 of transistor 160 is grounded at 168 and collector 170 is connected at junction 34 to the emitters 30 and 32 of transistors 26 and 28, respectively. It is thus seen that the overload sensing winding 92 is coupled to driver transistors 26 and 28 via a path that is parallel to the transformer coupled power transistors 60 and 62. Further, it is seen that the bases of transistors 26 and 28 are not biased off but are disabled due to their emitters 30 and 32, respectively, being raised above ground in an overload condition.

In another preferred embodiment, shown in FIG. 3, the circuit operation is the same as for the embodiment shown in FIGS. 1 and 2 for those components having the same reference numerals. In this preferred embodiment, as in the previous embodiment, secondary winding 84 of impedance-matching transformer 78 has one end 86 connected to terminal 96 of a speaker or speaker circuit 88 and the other end 90 through a single turn winding 92 to the other terminal 94 of speaker or load circuit 88. Single turn winding 92 is the primary of transformer 98 (FIG. 2) which has a secondary winding 100 connected at end 102 to the anode of diode 103 which has its cathode connected to terminal 104 of resistor 107 and at terminal 108 to capacitor 111. Resistor 105 is connected directly across winding 100 and serves to shape the waveform in the secondary circuit for noise immunity and responsiveness to an overload condition.

The other end 112 of secondary 100 is connected at point 114 to resistor 109 and at terminal 116 to capacitor 111. Silicon controlled rectifier 118 has its gate electrode 120 connected at juncture 123 between resistors 107 and 109, its anode 124 connected at junction 138 to resistor 126 and its cathode 128 connected through junctions 142 and 114 to resistor 130.

OPERATION

In the operation of the embodiment of FIG. 1, and as disclosed in the above-noted Smith patent, signal generator 20 applies an alternating signal to driver transistors 26 and 28 which is amplified and coupled to the terminals 42 and 46 of auto transformer 40. A pair of power transistors 60 and 62 is connected to the output terminals 52 and 54 of auto transformer 40, respectively, and operate in push-pull mode to further amplify the signal.

Current to operate transistors 26 and 28 flows through circuitry that includes conductive transistor 160 elements 166 and 170. The resistance between elements 166 and 170 is sufficient to maintain adequate operating voltage on emitters 30 and 32, a 1-volt drop to ground being exemplary. Upon transistor 160 becoming non-conductive, the collector-emitter resistance raises thereby effectively opening the supply circuit to emitters 30 and 32. Transistors 26 and 28 are thereby rendered inoperative. Transistor 160 therefore serves as a switching device for controlling the application of operating voltage to transistors 26 and 28.

The secondary winding 84 of impedance-matching transformer 78 is connected to and provides the driving signal for speaker circuit 88. Typically, speaker circuit 88 may comprise two voice-coil type speakers in parallel which, depending on the character of the signal generator 20 output, can generate a siren or voice sound. If a short circuit should occur in speaker circuit 88 across terminals 94 and 96, or if more speakers are connected in parallel than the circuit is designed to operate, an overload condition will exist in the secondary winding 84 circuit. This, under ordinary circumstances, would cause an overload condition in the circuit of primary winding 76 of transformer 78 which condition would tend to burn out power transistors 60 and 62. The circuit of this invention protects against the damaging effects of such overload condition.

When an overload condition exists, a strong surge of current is caused to flow through primary 92, causing a voltage to be induced in winding 100 of overload transformer 98. This voltage corresponds to the turns ratio between winding 100 and primary 92. In an overload condition, the voltage across winding 100 is impressed across potentiometer 106 and, depending on the setting of slider 122, a corresponding voltage will be applied to gate electrode 120 of normally non-conductive silicon controlled rectifier 118. The voltage applied to gate electrode 120 depends upon, and is adjustable by, this movement of slider 122. The potentiometer 106 may be replaced by two fixed value resistors, one resistor 114–122 being connected between gate electrode 120 and junction point 114 and the other resistors 104–122 being connected between gate electrode 120 and terminal 104.

When gate electrode 120 is so energized, silicon controlled rectifier 118 is caused to conduct. Current through resistors 126 and 144 results in a voltage being applied to the base 146 of normally non-conductive transistor 148 causing it to conduct. Conduction by transistor 148 reduces the voltage at junction 156 to substantially ground level since it is now connected to ground 152 through conducting transistor 148.

Lowering of the potential of junction 156 lowers the potential on base 158 of normally conductive transistor 160 causing it to become non-conductive thereby disabling transistor pair 26 and 28. Auto transformer winding 38 is deenergized, disabling power transistor pair 60 and 62 and opening the circuit for primary winding 72 of transformer 76. This protects power transistors 60 and 62 against the overload current that would otherwise be generated in winding 76 as a result of overload current in secondary winding 84.

During overload conditions, silicon controlled rectifier 118 is latched (maintained conductive). Silicon controlled rectifier 118 thus remaining conductive provides a control function which disables and otherwise maintains transistors 26 and 28 inoperative thereby to prevent burn-out of circuit components, especially transistors 60 and 62 while the overload condition persists. After correcting the overload condition, momentary opening of switch 165 will remove the supply voltage to silicon controlled rectifier 118, and the silicon controlled rectifier 118 will return to non-conductive state for normal speaker load.

It is seen that once an overload condition is sensed, the disruption of power to transistors 60 and 62 is caused by a signal flowing in a low power control path parallel to transistors 60 and 62. The power disruption is substantially immediate and occurs before any damage to transistors 60 and 62 can occur.

In the event of an overvoltage condition across terminal 164 and ground, zener diode 134 will conduct and turn "on" control transistor 148. Thus, the same protective action as the overcurrent condition is accomplished.

In some instances, momentary overvoltage may occur at terminal 164. When this occurs, zener diode 134 becomes conductive thus applying a positive bias to base 146 of transistor 148 rendering the latter conductive. As long as the overvoltage condition remains, the zener diode conducts thus resulting in the disablement of the amplifier output circuit, but the moment the voltage drops to normal, the zener diode becomes non-conductive thereby enabling the amplifier output circuit.

The switching time of the transistors 148 and 160 and the zener diode 134 is sufficiently fast to protect the output transistors 60 and 62 against burn-out and also the speaker circuit from excessive input power because of overvoltage at terminal 164.

The values of resistor 106 and capacitor 110 are selected to provide a substantially square waveform to gate 120 of silicon controlled rectifier 118. The resistor 106 and capacitor 110 being shunt connected across winding 100, serves to tune the latter to ensure a substantially square wave of voltage of sufficient energy to trigger the gate 120 of silicon controlled rectifier 118.

Using transformer 98 to couple the overload signal to the silicon controlled rectifier 118 has the advantage of isolating direct currents which may be present in the circuit of rectifier 118 from the speaker circuit 88. Further, negligible losses are caused by primary 92 of the transformer 98 in speaker circuit 88.

The operation of the embodiment of FIG. 3 is similar to that of the embodiment of FIGS. 1 and 2. However, in an overload condition, the voltage across winding 100 appears across shunt resistor 105 and is rectified through diode 103 and integrated by capacitor 111. Shunt resistor 105, diode 103, and capacitor 111 act to shape the waveform applied to gate electode 120 of normally non-conductive silicon controlled rectifier 118, so that transient noise pulses or spikes do not trigger rectifier 118 but overload conditions do trigger rectifier 118. Such noise pulses are particularly troublesome in very low temperature ambient weather. At temperatures of, for example, −30° F, the speaker coils are highly conductive thereby resulting in high current surges in speaker circuit 86, 90 when the amplifier is first turned "on." In the circuitry of FIG. 1, these initial, "cold," current surges may be of sufficient magnitude to cause triggering of the rectifier 118 and consequent activation of disabling transistor 160. This results in undesired shutting down of the amplifier. The circuit of FIG. 3 provides for sufficient time lag during start-up that current through the speaker coils causes an increase in the temperature thereof, hence resistance to reduce the level of current in the speaker circuit to a valve at which rectifier 118 will not be triggered.

By comparison, the circuit of FIG. 1 may be characterized as being sensitive to peak current and that of FIG. 3 to average current.

Resistors 107, 109, and 130 serve as a voltage divider which determines the voltage applied to electrode 120. The values of resistor 107, 109, 130 and capacitor 111 are selected to provide a substantially square waveform to gate 120 of silicon controlled rectifier 118. The resistors 107 and 109 and capacitor 111 being shunt connected across winding 100 and diode 103, serve to tune the signal to ensure a substantially square wave of sufficient energy to trigger silicon controlled rectifier 118 during an overload condition but to prevent response to a momentary noise spike.

In the following is listed values of the various components of working embodiments of this invention according to FIGS. 1–3, for B+ operation at 14V. and 28V., these values being given as exemplary only and not to be considered as limitative of the exemplary only and not to be considered as limitative of the invention:

| Reference Numeral | B+ 14V. RESISTORS | B+ 28V. |
|---|---|---|
| | All resistors are ¼ watt + 5% | |
| 162 | 510 ohms | 2.2K ohms |
| 144 | 1.5K ohms | 1.5K ohms |
| 126 | 120 ohms | 390 ohms |
| 130 | 120 ohms | 120 ohms |
| 107 | 180 Ohms | 180 ohms |
| 109 | 100 ohms | 100 ohms |
| 104–122 | 100 ohms | 100 ohms |
| | CAPACITORS | |
| 111 | 47.0 mfd. | 47.0 mfd. |
| | ZENER DIODE | |
| 134 | IN5245 15V. 5% | IN5256 30V. 5% |
| TRANSISTORS (for B+ 14V. and B+ 28V.) | | |
| 24, 26, 160 | TIP 41 | |
| 60, 62 | Delco DTG 600 series; selected for high current gain and high voltage breakdown or CP2357 (Carson Manufacturing Co., Indianapolis, Indiana) | |
| 148 | SKA 6183 | |
| RECTIFIERS (for B+ 14V. and B+ 28V.) | | |
| 118 | EC103A (SCR) | |
| 103 | IN457 | |
| Transformer 98 (for B+ 14V. and B+ 28V.) | | |
| | CP-2611 (Carson Manufacturing Co., Indianapolis, Indiana) | |
| Number of turns of winding 100 | 250 | |

| -continued | |
|---|---|
| Wire size of winding 100 | #36 |
| Core is powdered iron | |
| Inner Diameter of toroidal core | 1/4 inch |
| Outer Diameter of toroidal core | 1/2 inch |
| Cross-sectional dimensions of core | axial length 3/16 inch |
| | radial depth 1/8 inch |

While there have been described above the principles of this invention in connection with specific apparatus, it is to be clearly understood that this description is made only by way of example and not as a limitation to the scope of the invention.

What is claimed is:

1. Overload protective circuitry comprising:
   an audio amplifier having an output stage;
   a load circuit coupled to said output stage;
   current sensing means for generating an overload signal in response to an overload in said load circuit;
   circuit means for disabling said amplifier in response to said overload signal;
   coupling means for coupling said load circuit to said current sensing means and for isolating said load circuit from d.c. currents in said circuit means, said coupling means imparting negligible impedance to said load circuit;
   said output stage includes at least one amplifying device;
   a power supply circuit coupled to said amplifying device;
   said circuit means including a switching device coupled to said power supply circuit for operatively interrupting said power supply circuit to protect said amplifying device;
   said circuit means comprising a silicon controlled rectifier having anode, cathode and gate electrodes;
   a current supply circuit connected to the anode electrode of said rectifier;
   circuit control means coupling said cathode electrode to said power supply circuit to interrupt said power supply circuit in response to an "on" condition of said rectifier;
   said current sensing means being coupled to said gate electrode to trigger said rectifier "on" upon sensing an overload condition in said load circuit;
   said circuit control means comprising a first transistor and a second transistor, said first transistor being connected to said second transistor to control the current in said second transistor;
   said rectifier being connected to said first transistor to control the current in said first transistor, said first transistor being biased to an "on" condition upon an "on" condition of said rectifier and the second transistor being biased "off" upon an "on" condition of said first transistor; and
   said second transistor being series connected in said power supply circuit to interrupt said power supply circuit when said second transistor is in an "off" condition.

2. The circuitry of claim 1 with a zener diode being connected between said current supply voltage and said first transistor to bias said first transistor "on" when an oversupply condition of said current supply circuit occurs.

3. The circuitry of claim 1 with:
   a first resistor being connected between said current supply circuit and the anode of said silicon controlled rectifier; and
   a second resistor being connected between the cathode of said silicon controlled rectifier and ground.

4. The circuitry of claim 3 with:
   said first and second transistors each having a base, a collector and an emitter;
   a third resistor being connected between the cathode of said silicon controlled rectifier and the base of said first transistor; and
   a fourth resistor being connected between the base of said second transistor and said current supply circuit to provide a predetermined bias voltage to the base of said second transistor.

5. Overload protective circuitry comprising:
   a signal generator;
   a pair of driver transistors each having a base, emitter and collector, the bases of said driver transistors being connected to said signal generator in push-pull relation;
   an auto transformer winding having a first and a second output terminal, and a first and second input terminal connected intermediately of said first and second output terminals, said first input terminal being connected to the collector of one of said driver transistors and the second input terminal being connected to the collector of the other of said driver transistors;
   a power supply, said power supply being connected to said auto transformer winding at a point intermediate of said input terminals;
   a pair of power transistors each having a base, emitter and collector;
   the base of one of said power transistors being connected to one of said output terminals and the base of the other of said power transistors being connected to the other of said output terminals, the collectors of said power transistors being connected to ground;
   a second transformer having a primary winding and a secondary winding;
   the emitters of said power transistors being connected in spaced relation to said primary winding;
   a power supply being connected to said primary winding intermediately of said emitter connections to said primary winding;
   a speaker circuit having two speaker input terminals, said input terminals being connected to said secondary winding;
   an annular transformer core, a conductive lead connecting one of said speaker input terminals to said secondary winding passing through the opening defined by said core;
   a helical secondary winding being wound on said core;
   a voltage divider circuit being connected across said helical secondary winding;
   a capacitor being connected across said voltage divider circuit;
   a silicon controlled rectifier having a rectifier anode, a rectifier cathode and a gate, said gate being connected to an intermediate point in said voltage divider circuit;
   a rectifier current supply circuit being resistor connected to said rectifier anode and said rectifier cathode being resistor connected to ground;

a zener diode having a zener anode and a zener cathode, said zener anode being connected to said rectifier cathode, said zener cathode being connected to said rectifier anode;

a first and second transistor each having a base, emitter and collector, the emitters of said transistors being connected to ground;

said zener anode and said rectifier cathode being resistor connected to the base of said first transistor;

the collector of said first transistor being resistor connected to said rectifier current supply circuit and being connected to the base of said second transistor; and the collector of said second transistor being connected to each of the emitters of said driver transistors.

6. Overload protective circuitry comprising:
an audio amplifier having an output stage;
a load circuit coupled to said output stage;
current sensing means for generating an overload signal in response to an overload in said load circuit;
circuit means for disabling said amplifier in response to said overload signal;
coupling means for coupling said load circuit to said current sensing means and for isolating said load circuit from d.c. currents in said circuit means, said coupling means imparting negligible impedance to said load circuit;
said coupling means comprising a transformer having an annular magnetic core;
a secondary winding being wound on said core and connected to said circuit means;
a primary winding comprising a conductor extending through the opening defined by said annular core and connected to said load circuit;
said coupling means comprises a transformer having a primary winding and a secondary winding, said primary winding connected to said load circuit; said current sensing means comprising said secondary winding; a resistor being shunt connected across said secondary winding to form a parallel circuit with said secondary winding to shape the waveform from said secondary winding to make said current sensing means responsive to overload signals but unresponsive to noise signals; and
said circuit means comprises an integrating capacitor shunt connected across said parallel circuit; and a diode being connected between one terminal of said parallel circuit and one terminal of said integrating capacitor.

7. Overload protective circuitry comprising:
an audio amplifier having an output stage;
a load circuit coupled to said output stage;
current sensing means for generating an overload signal in response to an overload in said load circuit; and
circuit means for disabling said amplifier in response to said overload signal;
coupling means for coupling said load circuit to said current sensing means and for isolating said load circuit from d.c. currents in said circuit means, said coupling means imparting negligible impedance to said load circuit;
said output stage includes at least one amplifying device;
a power supply circuit coupled to said amplifying device;
said circuit means including a switching device coupled to said power supply circuit for operatively interrupting said power supply circuit to protect said amplifying device;
said circuit means comprising a silicon controlled rectifier having anode, cathode and gate electrodes;
a current supply circuit connected to the anode electrode of said rectifier;
circuit control means coupling said cathode electrode to said power supply circuit to interrupt said power supply circuit in response to an "on" condition of said rectifier;
said current sensing means being coupled to said gate electrode to trigger said rectifier "on" upon sensing an overload condition in said load circuit;
said coupling means comprises a transformer having a primary winding and a secondary winding, said primary winding connected to said load circuit; said current sensing means comprising said secondary winding; a resistor being shunt connected across said secondary winding to form a parallel circuit with said secondary winding to shape the waveform from said secondary winding to make said current sensing means responsive to overload signals but unresponsive to noise signals; and
said circuit means comprises an integrating capacitor shunt connected across said parallel circuit; and a diode connected between one terminal of said parallel circuit and one terminal of said integrating capacitor.

* * * * *